(12) United States Patent
Jung et al.

(10) Patent No.: US 7,663,147 B2
(45) Date of Patent: Feb. 16, 2010

(54) DISPLAY APPARATUS AND FABRICATING METHOD THEREOF

(75) Inventors: Jae-hoon Jung, Seongnam-si (KR); Nam-deog Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 343 days.

(21) Appl. No.: 11/515,540

(22) Filed: Sep. 5, 2006

(65) Prior Publication Data
US 2007/0092981 A1 Apr. 26, 2007

(30) Foreign Application Priority Data
Oct. 24, 2005 (KR) .................. 10-2005-0100399

(51) Int. Cl.
*H01L 29/04* (2006.01)
(52) U.S. Cl. ............... 257/72; 257/59; 257/E25.008; 257/E25.009; 257/E51.022
(58) Field of Classification Search ............ 257/72, 257/82, 83, 40, 59, 642, E25.008, E25.009, 257/E51.008
See application file for complete search history.

(56) References Cited

U.S. PATENT DOCUMENTS 7,250,634 B2 * 7/2007 Yokoyama et al. ............ 257/83

| | | |
|---|---|---|
| 2001/0015783 A1 | 8/2001 | Ohta et al. |
| 2004/0227888 A1 | 11/2004 | Tak et al. |
| 2005/0023969 A1 * | 2/2005 | Omata et al. ........... 313/504 |
| 2005/0184653 A1 | 8/2005 | Suh et al. |
| 2007/0231604 A1 * | 10/2007 | Ohkubo et al. ........... 428/704 |

FOREIGN PATENT DOCUMENTS

| | | |
|---|---|---|
| CN | 1456026 | 11/2003 |
| CN | 1505166 | 6/2004 |
| CN | 1625714 | 6/2005 |
| JP | 2001-203081 | 7/2001 |
| JP | 2002-216976 | 8/2002 |
| JP | 2003140188 | 5/2003 |
| JP | 2005-268616 | 9/2005 |
| WO | 2004/023436 | 3/2004 |
| WO | 2005/083722 | 9/2005 |

* cited by examiner

*Primary Examiner*—Quoc D Hoang
(74) *Attorney, Agent, or Firm*—Cantor Colburn LLP

(57) ABSTRACT

A display apparatus and method of forming the same comprise an insulating substrate; a thin film transistor formed on the insulating substrate; a first electrode electrically connected to the thin film transistor and having a first maximum roughness; a buffer layer formed on the first electrode and having a second maximum roughness lower than the first maximum roughness; an organic emission layer formed on the buffer layer; and a second electrode formed on the organic emission layer. Accordingly, it is an aspect of the present invention to provide a display apparatus and method of manufacturing the same which reduce the number of defects due to roughness of a pixel electrode.

16 Claims, 11 Drawing Sheets

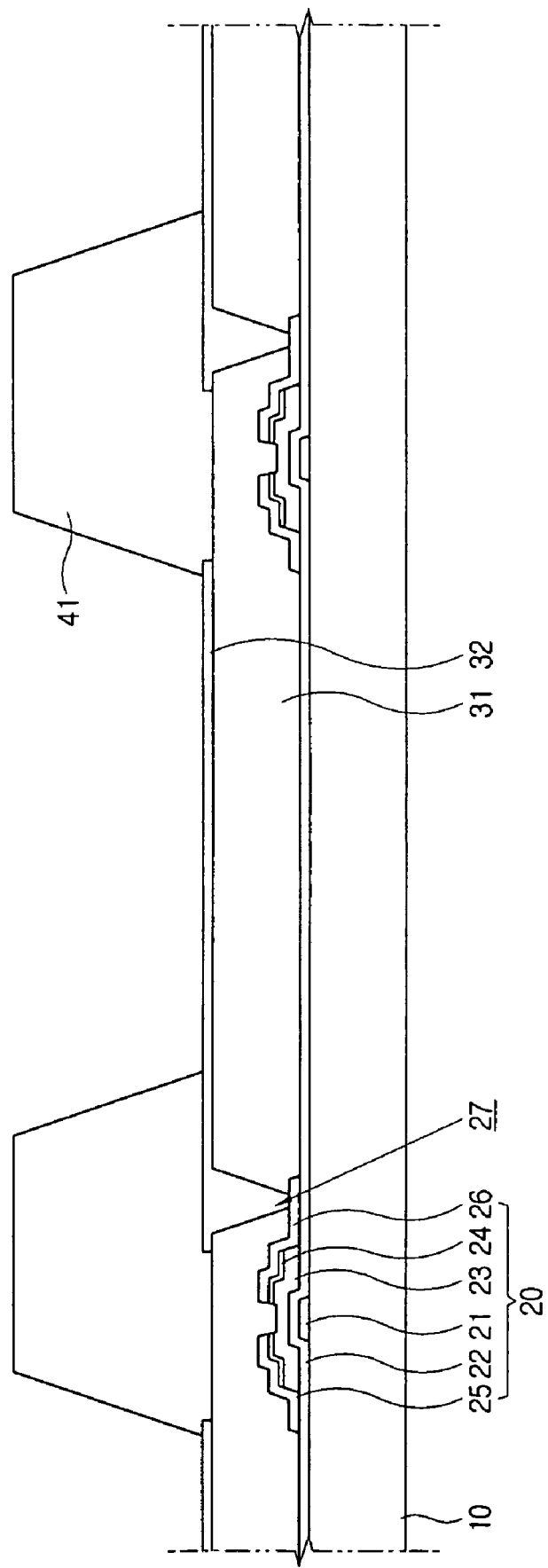

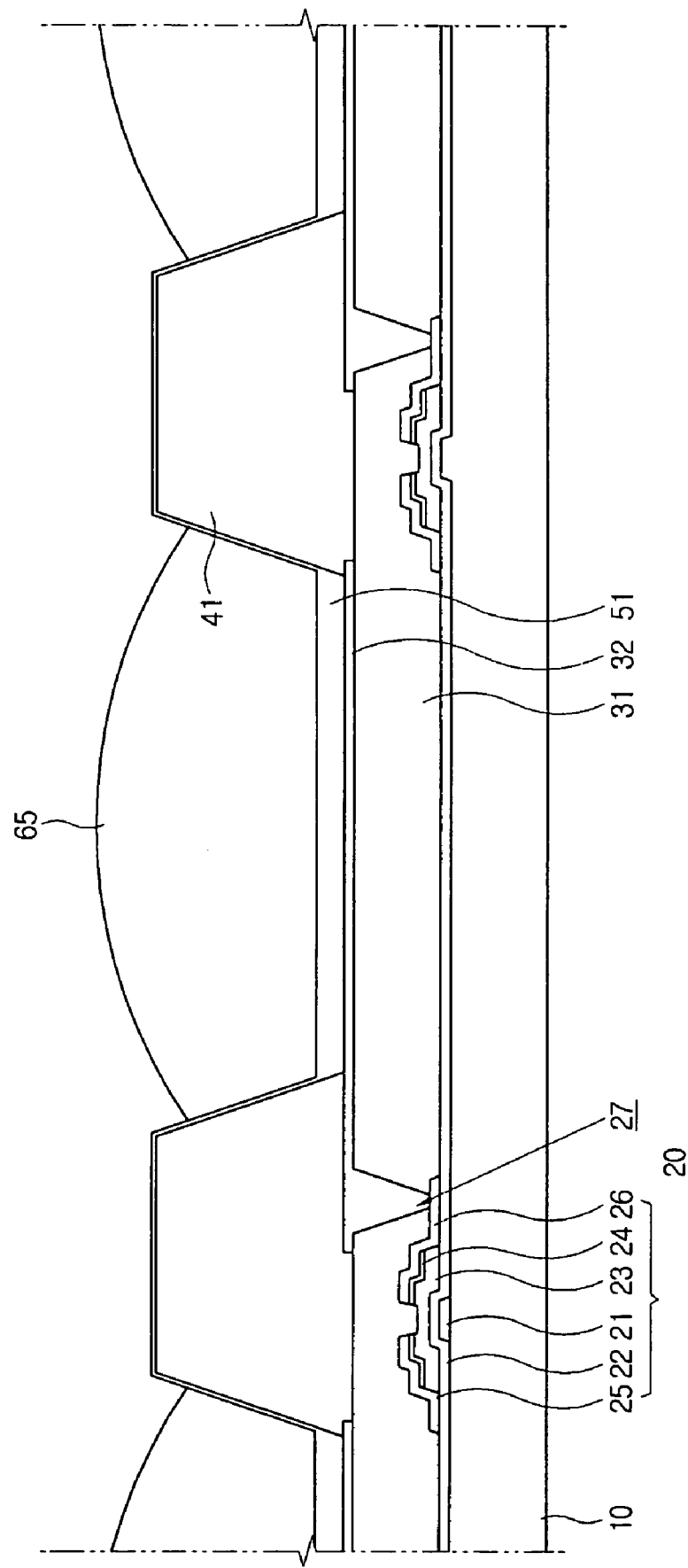

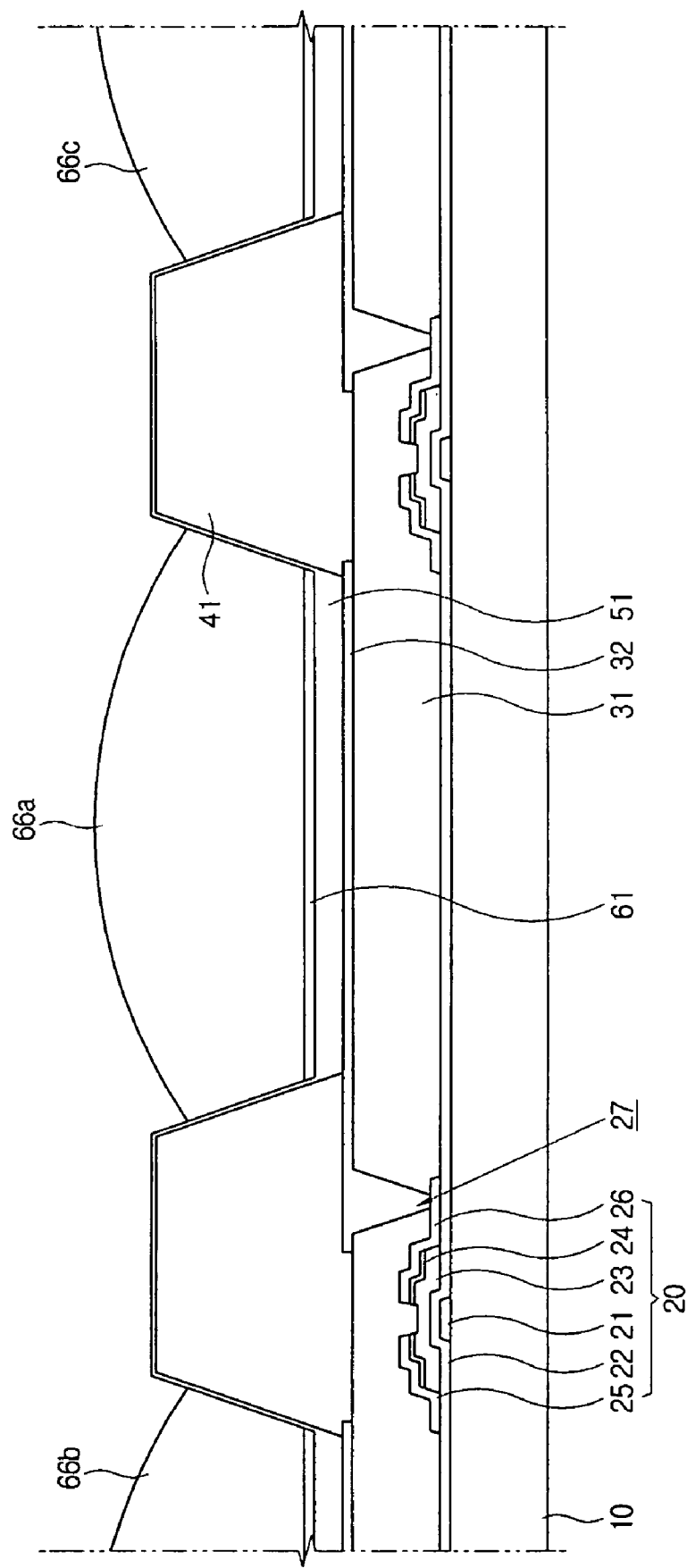

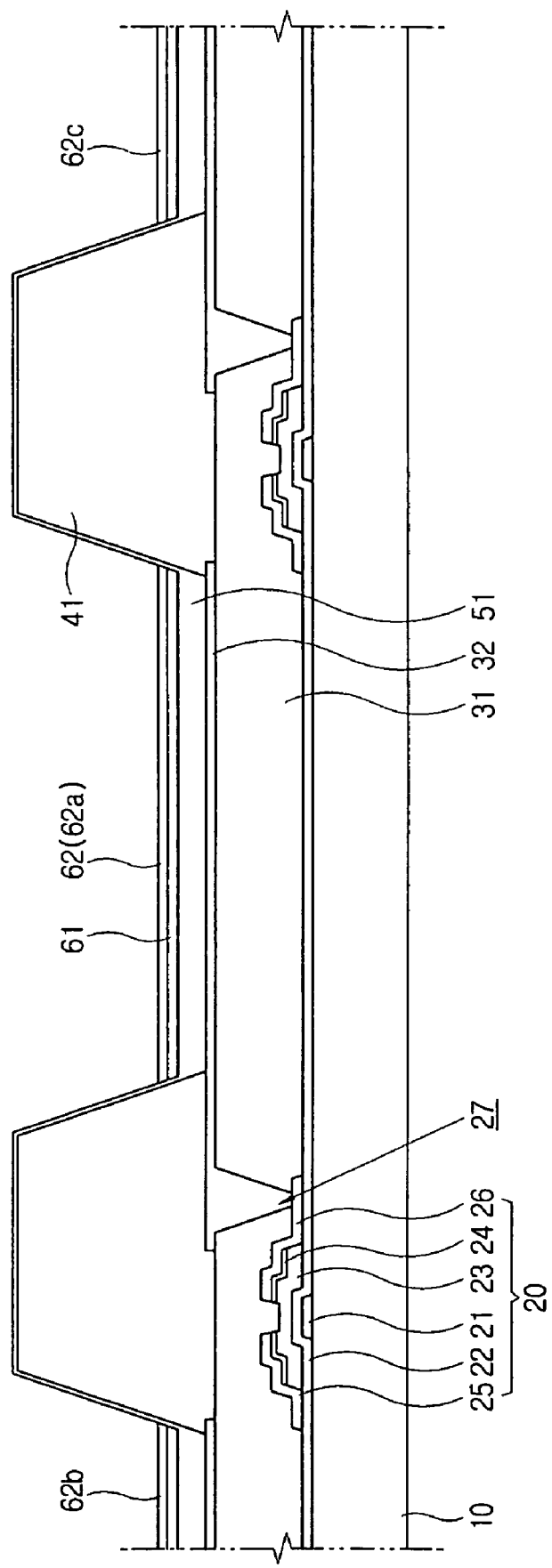

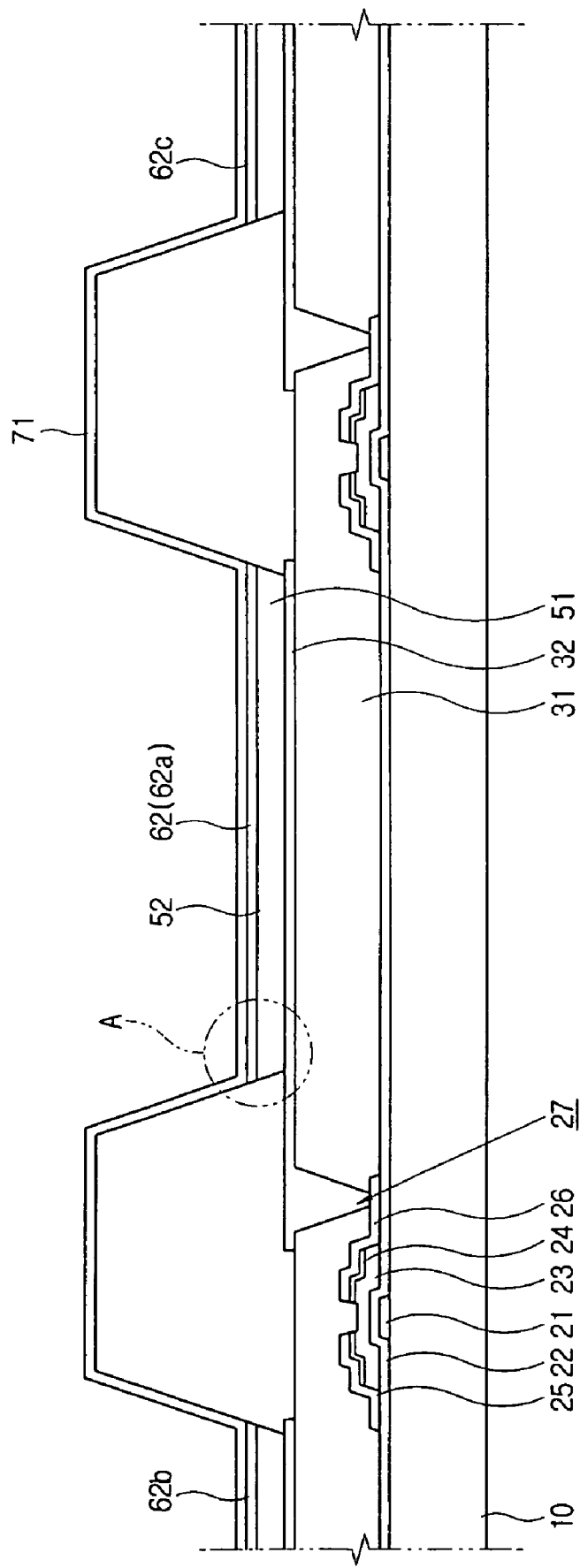

US 7,663,147 B2

DISPLAY APPARATUS AND FABRICATING METHOD THEREOF

This application claims priority to Korean Patent Application No. 2005-0100399, filed on Oct. 24, 2005, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a fabricating method thereof, and more particularly, to a display apparatus in which a buffer layer with low surface roughness is formed on a pixel electrode and a method of fabricating the same.

2. Description of the Related Art

Among flat panel displays, organic light emitting diode ("OLED") displays have recently attracted attention because they may be driven with a low voltage, they are both thin and lightweight, have a wide viewing angle, and have a relatively short response time. OLED displays may be classified into either passive matrix type or active matrix type displays according to the driving methods used.

In the active matrix type of OLED display, a thin film transistor is connected to each pixel region and accordingly controls the emission of an organic emission layer. Each pixel region includes a pixel electrode. Each pixel electrode is electrically disconnected from every other pixel electrode adjacent thereto, so that each pixel can be driven independently. An organic layer, such as a hole injection layer and an organic emission layer, are provided on the pixel electrode.

Typically, the pixel electrode is formed by applying indium tin oxide (ITO) or indium zinc oxide (IZO) via a deposition method such as sputtering onto a passivation layer. One disadvantage of this technique is that the pixel electrode is formed with spikes protruding from the surface thereof, and thereby has a relatively large surface roughness. This large surface roughness prevents the organic layer to be formed on the pixel electrode from obtaining a uniform surface. In particular, the organic layer formed on top of the spikes is relatively thin. This thin organic layer is more likely to be broken due to an electric field which concentrates on the spike when driving the OLED. Once a break occurs, the broken organic layer acts as a path for a leakage current, thereby causing a dark spot or a dark pixel.

BRIEF SUMMARY OF THE INVENTION

Accordingly, it is an aspect of the present invention to provide a display apparatus where defects due to the roughness of a pixel electrode are reduced, or effectively prevented.

Another aspect of the present invention is to provide a method of fabricating a display apparatus where defects due to the roughness of a pixel electrode are reduced, or effectively prevented.

The foregoing and/or other aspects of the present invention can be achieved by providing an exemplary embodiment of a display apparatus including an insulating substrate, a thin film transistor formed on the insulating substrate, a first electrode electrically connected to the thin film transistor and having a first maximum roughness, a buffer layer formed on the first electrode and having a second maximum roughness smaller than the first maximum roughness, an organic emission layer formed on the buffer layer and a second electrode formed on the organic emission layer.

According to another exemplary embodiment of the present invention, the second maximum roughness is smaller than about 100 Å.

According to another exemplary embodiment of the present invention, the buffer layer has an average roughness of about 10 Å or less.

According to another exemplary embodiment of the present invention, the thickness of the buffer layer on the first electrode is about 1.2 to about 10 times larger than the first maximum roughness.

According to another exemplary embodiment of the present invention, the thickness of the buffer layer on the first electrode ranges from about 1,200 Å to about 10,000 Å.

According to another exemplary embodiment of the present invention, the buffer layer has a work function ranging from about 4.7 eV to about 5.5 eV.

According to another exemplary embodiment of the present invention, the buffer layer has a light transmissivity of about 85% or more.

According to another exemplary embodiment of the present invention, the buffer layer has a specific resistance of about 100 Ωcm or less.

According to another exemplary embodiment of the present invention, the buffer layer comprises a hole injecting material.

According to another exemplary embodiment of the present invention, the buffer layer includes poly(3,4-ethylene di-oxythiophene), and polystyrene sulfonic acid.

According to another exemplary embodiment of the present invention, the buffer layer includes indium tin oxide (ITO) formed by a sol-gel method.

According to another exemplary embodiment of the present invention, the first electrode includes indium tin oxide (ITO) and is formed by a sputtering method.

According to another exemplary embodiment of the present invention, the buffer layer includes a conductive polymer.

According to another exemplary embodiment of the present invention, the buffer layer includes one selected from a group consisting of polypyrrole, polyaniline and polythiophene.

According to another exemplary embodiment of the present invention, the display apparatus further includes a partition wall that divides the first electrodes.

According to another exemplary embodiment of the present invention, the buffer layer extends to an upper part of the partition wall.

According to another exemplary embodiment of the present invention, the thickness of the buffer layer on the first electrode is larger than the thickness of the buffer layer on the upper part of the partition wall.

The foregoing and/or other aspects of the present invention are also achieved by providing an exemplary embodiment of a method of fabricating a display apparatus including: forming a thin film transistor on an insulating substrate; forming a first electrode electrically connected to the thin film transistor, the first electrode having a first maximum roughness; forming a buffer layer on the first electrode, the buffer layer having a second maximum roughness smaller than the first maximum roughness; forming an organic emission layer on the buffer layer and forming a second electrode on the organic emission layer.

According to another exemplary embodiment of the present invention, the forming the buffer layer includes coating a buffer solution on the first electrode.

According to another exemplary embodiment of the present invention, the buffer solution is coated by a spin coating method or a slit coating method.

According to another exemplary embodiment of the present invention, the forming the buffer layer includes hardening the coated buffer solution.

According to another exemplary embodiment of the present invention, the hardening the coated buffer solution uses heat or ultraviolet rays.

According to another exemplary embodiment of the present invention, the buffer layer includes indium tin oxide (ITO) and is formed by a sol-gel method.

According to another exemplary embodiment of the present invention, the first electrode is formed by a sputtering method.

According to another exemplary embodiment of the present invention, forming the organic emission layer on the buffer layer is performed by an inkjet printing method.

BRIEF DESCRIPTION OF THE DRAWINGS

The above and/or other aspects and advantages of the present invention will become apparent and more readily appreciated from the following detailed description of the present invention, taken in conjunction with the accompanying drawings in which:

FIGS. 3A through 3F are cross-sectional views illustrating an exemplary embodiment of a fabricating method of the display apparatus according to the present invention, wherein FIG. 3C is an enlarged view of circle 'C' shown in FIG. 3B;

FIG. 4 is a cross-sectional view of another exemplary embodiment of a display apparatus according to the present invention.

DETAILED DESCRIPTION OF THE INVENTION

Figure 1:
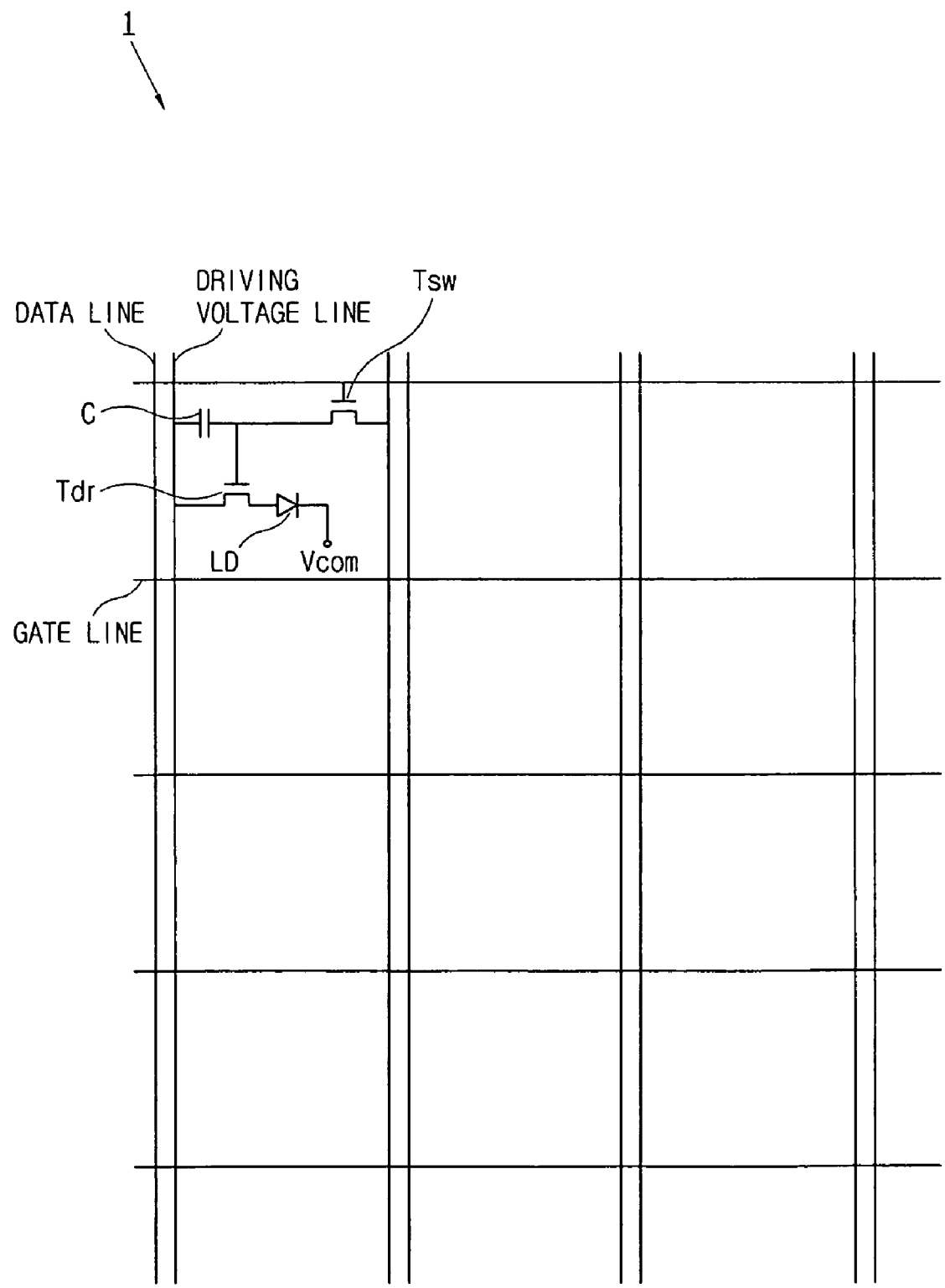
FIG. 1 is an equivalent circuit schematic diagram of an exemplary embodiment of a display apparatus according to the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein.

Rather, these exemplary embodiments are provided so that this disclosure will be thorough and complete and will fully convey the concept of the invention to those skilled in the art. Like reference numerals refer to like elements throughout the specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

FIG. 1 is an equivalent circuit schematic diagram of an exemplary embodiment of a display apparatus according to the present invention.

Referring to FIG. 1, a display apparatus 1 according to the present exemplary embodiment includes a plurality of signal lines.

The signal lines include a gate line to transmit a scan signal, a data line to transmit a data signal and a driving voltage line to apply a driving voltage. The data line and the driving voltage lines are adjacent to and arranged substantially parallel with each other. The gate line is arranged substantially perpendicular to and intersects the data line and the driving voltage line.

A pixel includes an organic light emitting device LD, a switching transistor Tsw, a driving transistor Tdr and a capacitor C.

The driving transistor Tdr has a control terminal connected to the switching transistor Tsw, an input terminal connected to the driving voltage line, and an output terminal connected to the organic light emitting device LD.

The organic light emitting device LD has an anode connected to the output terminal of the driving transistor Tdr. and a cathode connected to a common voltage Vcom. The organic light emitting device LD emits light with a brightness which varies according to the intensity of a current outputted from the driving transistor Tdr. The intensity of the current outputted from the driving transistor Tdr varies according to voltages applied between the control terminal and the output terminal of the driving transistor Tdr. A collection of similar light emitting devices may work in concert to display an image.

The switching transistor Tsw has a control terminal connected to the gate line, an input terminal connected to the data line, and an output terminal connected to the control terminal of the driving transistor Tdr. The switching transistor Tsw transmits the data signal applied to the data line to the driving transistor Tdr in response to the scan signal applied to the gate line.

The capacitor C is connected between the control terminal and the input terminal of the driving transistor Tdr. The side of the capacitor connected to the input terminal of the driving transistor Tdr is also connected to the driving voltage line. The capacitor C stores and maintains the data signal to be inputted to the control terminal of the driving transistor Tdr.

Below, the exemplary embodiment of a display apparatus according to the present invention will be described with reference to FIGS. 2 and 2A.

The display apparatus 1 includes a thin film transistor 20 formed on an insulating substrate 10, a pixel electrode 32 electrically connected to the thin film transistor 20, and an organic emission layer 62 formed on the pixel electrode 32.

In an exemplary embodiment, amorphous silicon is used to make the thin film transistor 20, but the present invention is not limited thereto. Alternative exemplary embodiments include configurations where poly-silicon may be used to make the thin film transistor 20.

The insulating substrate 10 may be made of an insulating material such as glass. Alternative exemplary embodiments include quartz, plastic or similar substances. A gate electrode 21 is formed on the insulating substrate 10.

A gate insulating layer 22 including silicon nitride (SiNx) or another similar substance is formed on the insulating substrate 10 and the gate electrode 21. A semiconductor layer 23 including amorphous silicon and an ohmic contact layer 24 including n+ hydrogenated amorphous silicon highly doped with an n-type dopant are formed in sequence on the gate insulating layer 22 corresponding to the gate electrode 21. The ohmic contact layer 24 is separated into two parts with respect to the gate electrode 21.

A source electrode 25 and a drain electrode 26 are formed on the ohmic contact layer 24 and the gate insulating layer 22. Further, the source electrode 25 and the drain electrode 26 are separated from each other with respect to the gate electrode 21.

A passivation film 31 is formed on the source electrode 25, the drain electrode 26, the exposed side portions of the ohmic contact layer 24, and an upper part of the semiconductor layer 23 which is not covered with the source and drain electrodes 25 and 26. The passivation film 31 may include silicon nitride ("SiNx") and/or an organic film. The passivation film 31 is formed with a contact hole 27 to expose the drain electrode 26 therethrough.

The pixel electrode 32 is then formed on the passivation film 31. The pixel electrode 32, which can also be called an anode, supplies holes to the organic emission layer 62. The pixel electrode 32 includes a transparent conductive material such as indium tin oxide (ITO) or indium zinc oxide (IZO), and may be formed by a sputtering method. The surface of the pixel electrode 32 may have a maximum roughness, Rmax1, of about 1,000 Å. That is, the difference between the height of the highest peaks and lowest valleys of the surface of the pixel electrode 32 is about 1,000 Å. According to an exemplary embodiment, the pixel electrode 32 may be approximately patterned to have a rectangle shape when seen from above (e.g., a top plan view).

A partition wall 41 is formed above the thin-film transistor 20 and is partially formed on and partially covers the pixel electrodes 32. The partition wall 41 divides the pixel electrodes 32 and defines a pixel region. The partition wall 41 is additionally formed on the contact hole 27. Further, the partition wall 41 prevents the source electrode 25 and the drain electrode 26 of the thin film transistor 20 from being short-circuited with a common electrode 71. The partition wall 41 includes a photosensitive, heat and solvent resistant material, exemplary embodiments of which include an acryl resin, a polyimide resin, and similar substances; or inorganic materials such as silicon dioxide (SiO2) and titanium dioxide (TiO2). Alternative exemplary embodiments include configurations where, the partition wall 41 may have a two-layered structure including an organic layer and an inorganic layer.

A buffer layer 51 is formed on the pixel electrode 32 and the partition wall 41.

Figure 2:
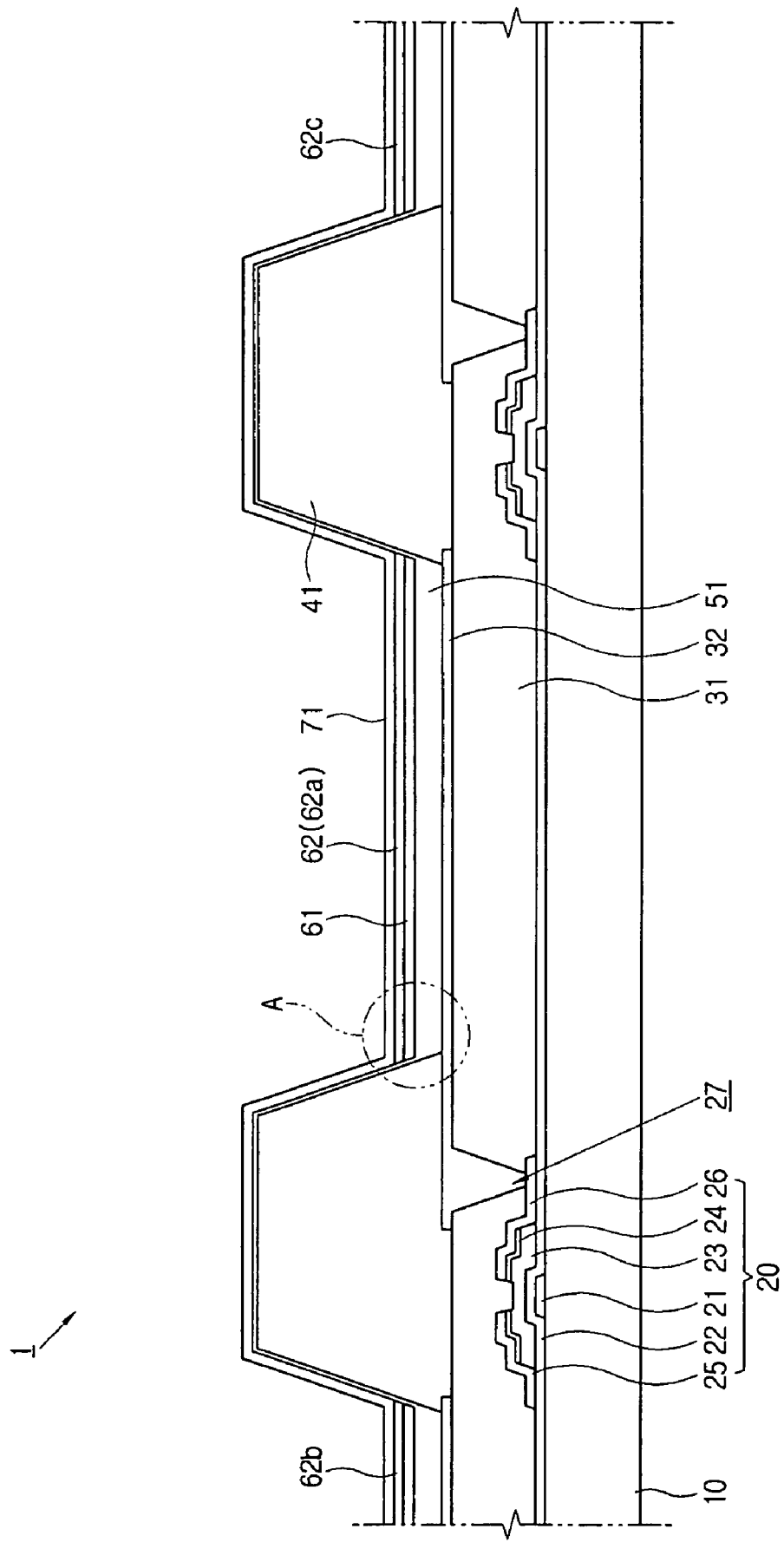
FIG. 2 is a cross-sectional view of the exemplary embodiment of the display apparatus of FIG. 1 according to the present invention.
Figure 2A:
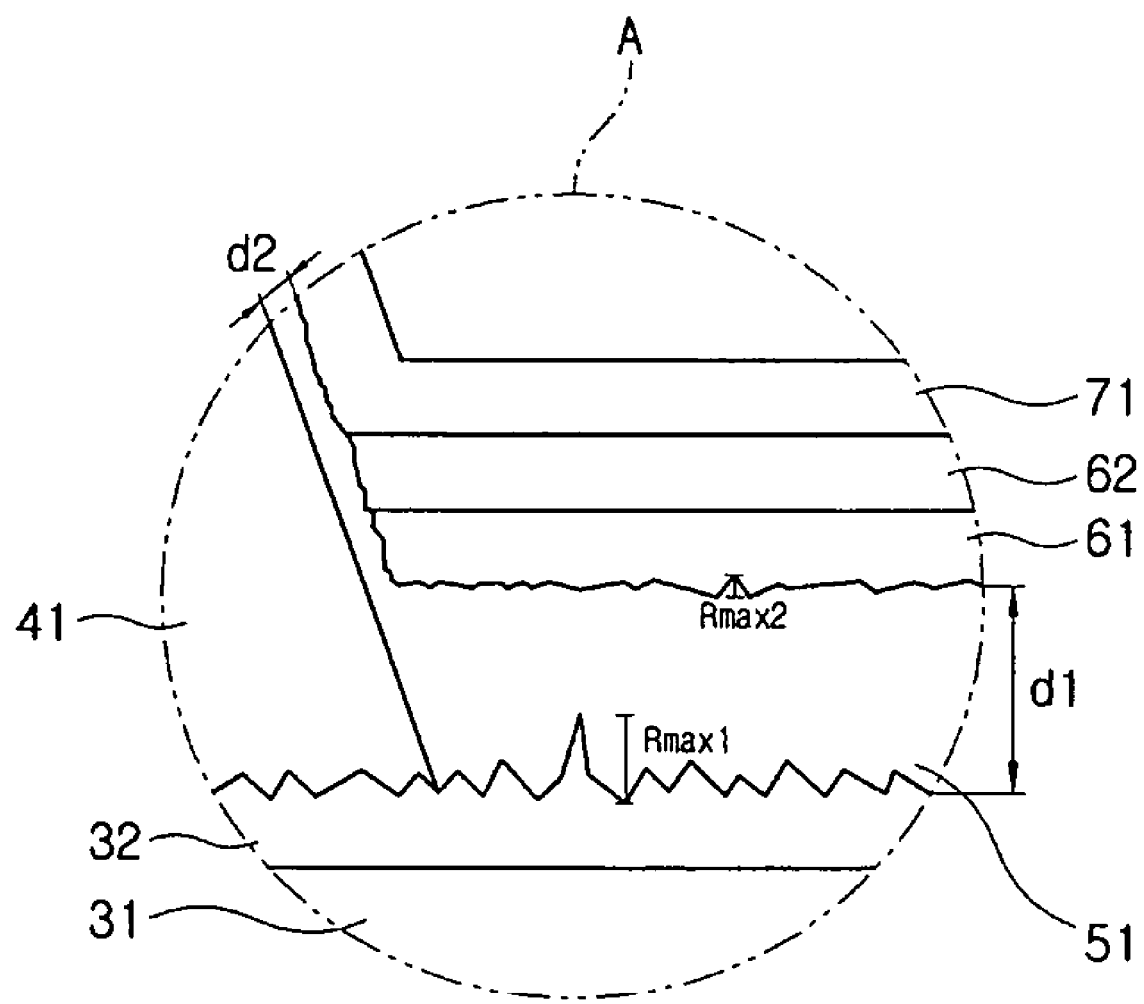
FIG. 2A is an enlarged view of circle 'A' shown in FIG. 2.

As shown in FIG. 2A, an enlarged view of the area in the dotted line circle 'A' of FIG. 2, the buffer layer 51 is relatively smooth when compared with the pixel electrode 32. The buffer layer 51 may have a maximum roughness Rmax2 of about 100 Å or less, and an average roughness Ravg of about 10 Å or less. Specifically, the maximum roughness Rmax2 of the buffer layer 51 may range from about 10 Å to about 100 Å, and the average roughness Ravg of the buffer layer 51 may range from about 1 Å to about 10 Å.

The thickness d1 of the buffer layer 51 covering the pixel electrode 32 may be 1.2 to 10 times larger than the maximum roughness Rmax1 of the pixel electrode 32, i.e., the thickness may range from about 1,200 Å to about 10,000 Å. However, when the thickness d1 of the buffer layer 51 formed on the pixel electrode 32 is smaller than 1,200 Å, the buffer layer 51 may not adequately buffer the roughness of the pixel electrode 32. Additionally, when the thickness d1 is larger than 10,000 Å, the resistance of the buffer layer 51 increases greatly and the light transmissivity thereof decreases.

The thickness d2 of the buffer layer 51 covering the partition wall 41 is relatively small as compared with the thickness d1 of the buffer layer 51 covering the pixel electrode 32. This is because the buffer layer 51 is formed by coating the partition wall 41 and the pixel electrode 32 with a liquid material; and thus the liquid material flows down from the partition wall 41 to the pixel electrode 32. Alternative exemplary embodiments include configurations where the upper part of the partition wall 41 may be left substantially uncovered by the buffer layer 51.

The buffer layer 51 may have a specific resistance of 100 Ωcm or less. When the display apparatus 1 employs a current driving method, as in this exemplary embodiment, it is desirable to form a buffer layer 51 with a low resistance. Exemplary embodiments of the buffer layer 51 may have a specific resistance ranging from about 10 Ωcm to about 100 Ωcm.

In the display apparatus 1 according to the present embodiment, the organic emission layer 62 emits light toward the insulating substrate 10, so that the light transmissivity of the buffer layer 51 becomes important. The buffer layer 51 may have a light transmissivity of about 85% or more. Exemplary embodiments provide that the light transmissivity of the buffer layer 51 may range from about 85% to about 95%.

The organic emission layer 62 receives the holes from the pixel electrode 32. To improve hole injection efficiency, the buffer layer 51 preferably has a work function similar to that of the pixel electrode 32. When ITO is used as the pixel electrode 32, it has a work function of about 5.0 eV. Therefore it is preferable that the buffer layer 51 has a work function ranging from about 4.7 eV to about 5.5 eV.

In one exemplary display apparatus the buffer layer 51 may include ITO or conductive polymer. In such an exemplary embodiment, ITO is made by a sol-gel method, and the conductive polymer may include one of polypyrrole, polyaniline and polythiophene.

A hole injecting layer 61 and the organic emission layer 62 may be formed on the buffer layer 51.

The hole injecting layer 61 may include a mixture of polythiophene derivatives such as poly(3,4-ethylene di-oxythiophene: PEDOT) or similar substances, and polystyrene sulfonic acid.

The organic emission layer 62 may include a red emission layer 62a, a green emission layer 62b and a blue emission layer 62c.

The organic emission layer 62 may include a polyfluorene derivative, a (poly)para phenylene vinylene derivative, a polyphenylene derivative, polyvinylcarbazole, polythiophene derivative; or any one of these polymer materials doped with perylene pigment, rothermere pigment, rubrene pigment, perilene, 9,10-diphenylanthracene, tetraphenylbutadiene, nile red, coumarin 6, quinacridone, or other similar substances.

The holes from the pixel electrode 32 and the electrons from the common electrode 71 are combined into an exciton in the organic emission layer 62, and light is emitted through the inactivation process of the exciton.

In one exemplary display apparatus, the hole injecting layer 61 and the organic emission layer 62 are formed on the relatively smooth buffer layer 51. Even though the pixel electrode 32 may be relatively rough, the buffer layer 51 provides a relatively smooth base surface for the hole injecting layer 61 and the organic emission layer 62. This smooth base allows the hole injecting layer 61 and the organic emission layer 62 to have a relatively uniform thickness. Therefore, the hole injecting layer 61 and/or the organic emission layer 62 are prevented from being broken by an electric field concentrated thereon.

The common electrode 71 is formed on the partition wall 41 and the organic emission layer 62. The common electrode 71, which is can also be referred to a cathode, supplies the electrons to the organic emission layer 62. Although not illustrated in FIG. 2, alternative exemplary embodiments include configurations where the common electrode 71 has a two-layered structure of a calcium layer and an aluminum layer. In such an exemplary embodiment one layer having a work function lower than the other layer is adjacent to the organic emission layer 62.

Although not illustrated in FIG. 2 or 2A, a lithium fluoride layer may be interposed between the organic emission layer 62 and the common electrode 71 to increase the light emission efficiency of the emission layer 62, depending on the composition of the emission layer 62. In exemplary embodiments where the common electrode 71 includes an opaque material such as aluminum, silver, and similar substances, the light may be emitted from the organic emission layer 62 toward the insulating substrate 10. This type of display is referred to as bottom emission type display.

Alternative exemplary embodiments of the display apparatus 1 include an electron transfer layer (not shown) and an electron injection layer (not shown) between the organic emission layer 62 and the common electrode 71. Also, the display apparatus 1 may include another passivation film for the common electrode 71. Alternative exemplary embodiments include the configuration where the display apparatus 1 includes an encapsulating member to encapsulate the organic emission layer 62 against moisture and air. The encapsulating member may include an encapsulating resin and an encapsulating can.

Below, an exemplary embodiment of a method of fabricating the display apparatus according to the present invention will be described with reference to FIGS. 3A through 3F.

First, the thin film transistor 20, the passivation film 31, the pixel electrode 32 and the partition wall 41 are formed on the insulating substrate 10 as shown in FIG. 3A.

The thin film transistor 20 may include an amorphous silicon channel part, which may be fabricated by any of several different well-known methods.

After forming the thin film transistor 20, the passivation film 31 is formed thereon. In an exemplary embodiment where the passivation film 31 includes silicon nitride, it is possible to use a chemical vapor deposition ("CVD") method to form the passivation film 31. Then, the passivation film 31 is photolithographed to form the contact hole 27 exposing the drain electrode 26. The pixel electrode 32 is then formed and fills the contact hole 27 to become electrically connected to the drain electrode 26. The pixel electrode 32 may be formed by depositing ITO using a sputtering method.

The partition wall 41 is formed by coating the pixel electrode 32 and the exposed passivation layer 31 with a photosensitive material, exposing it, and then developing the photosensitive material.

Figure 3B:
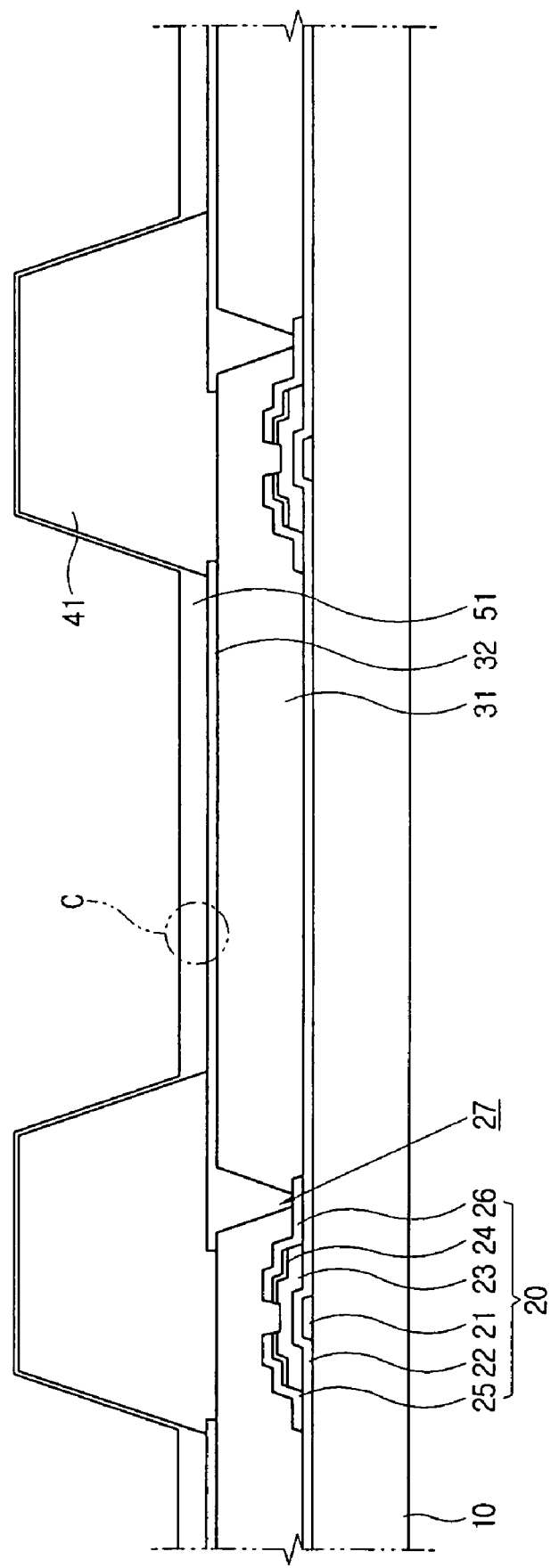

Then, as shown in FIG. 3B, the buffer layer 51 is formed on the pixel electrode 32 and the partition wall 41.

The buffer layer 51 is formed by coating the pixel electrode 32 and the partition wall 41 with a buffer solution containing a buffering material, and hardening the buffer solution. Here, the coating method for the buffer solution may include a slit coating method and a spin coating method. Further, the hardening method may use heat or ultraviolet rays. In exemplary embodiments where the buffer layer 51 includes ITO, the buffer layer 51 may be formed by applying the sol-gel method to the coated ITO.

Figure 3C:
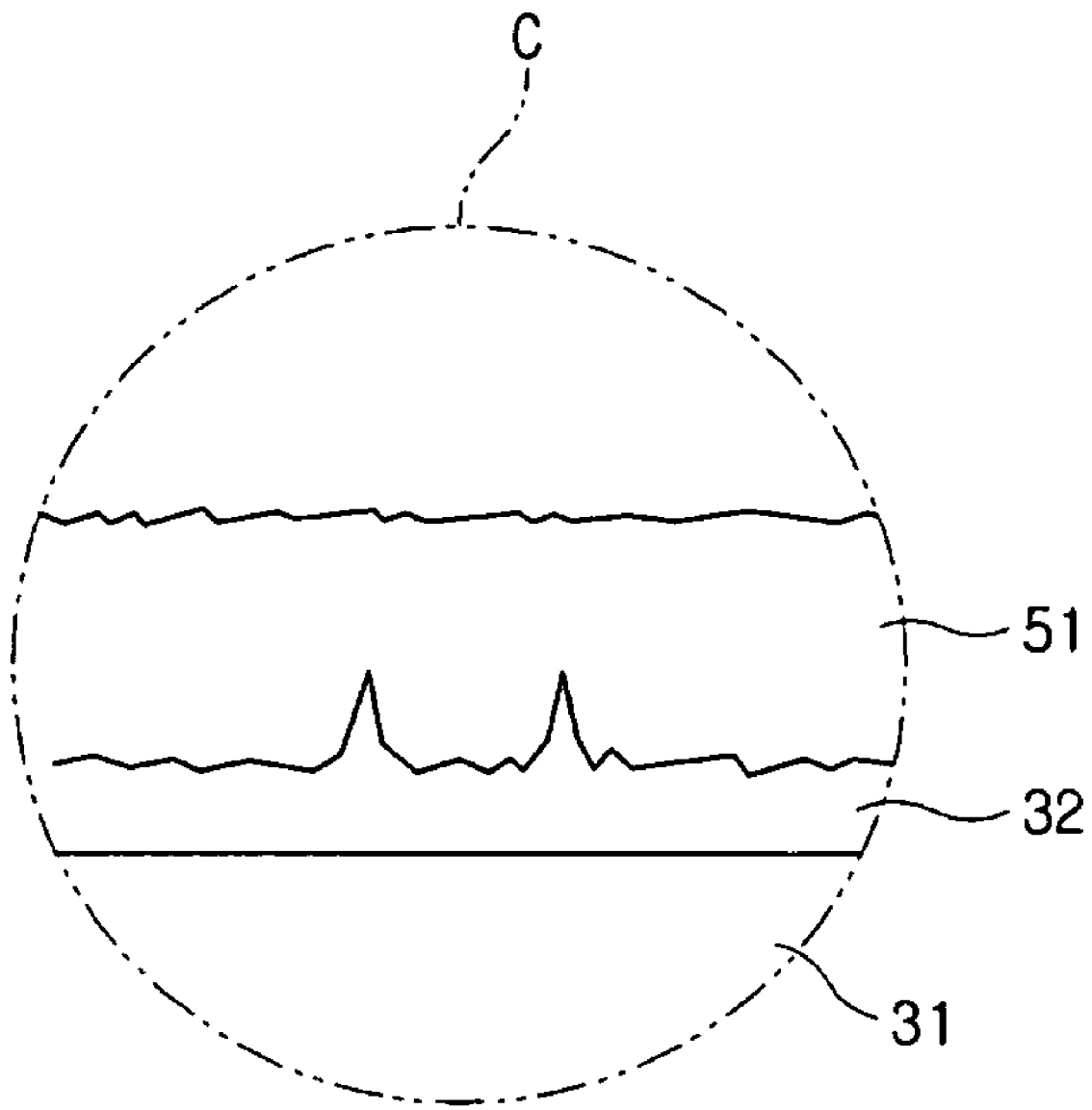

In this exemplary embodiment, a liquid state material is used to form the buffer layer 51. Therefore, as shown in FIG. 3C, an enlarged view of the area in the dotted line circle 'C' of FIG. 3B, the buffer layer 51 may be relatively smooth independent of the roughness of the pixel electrode 32 underneath it. The use of a liquid state material to deposit the buffer layer produces a smoother buffer layer surface than when a solid state material is directly used to form the buffer layer on the pixel electrode.

The buffer layer 51 is formed using a liquid state material without a separate patterning process and as a result it may be formed on the partition wall 41. However, the buffer solution flows down along the partition wall 41, so that the buffer layer 51 is thicker on the pixel electrode 32 than the partition wall 41.

The buffer layer solution may not cover the entire partition wall 41 because of thinning due to the flowing action. However, even if the solution did fully coat the partition wall 41 and electrically connected adjacent pixel electrodes 32 such an electric connection may be ignored. The thickness of the buffer layer 51 formed on the partition wall 41 is relatively thin and has high resistance and the distance between the adjacent pixel electrodes 32 is relatively large as compared with the distance between the pixel electrode 32 and the organic emission layer 62, thereby rendering negligible any electrical connection between adjacent pixel electrodes 32 caused by the buffer layer 51.

Alternative exemplary embodiments include configurations where the buffer layer 51 may be formed by a separate patterning process such as photolithography.

FIG. 3D illustrates that a hole injecting solution 65, one exemplary embodiment of which is a polymer solution containing a hole injecting material, is dropped onto the buffer layer 51 by an inkjet method to form the hole injection layer 61. The hole injecting solution 65 may include a mixture of polythiophene derivatives such as poly(3,4-ethylene di-oxythiophene: PEDOT) or similar substances, and polystyrene sulfonic acid (PSS) or similar substances; and a polar solvent in which these mixtures are dissolved. Exemplary embodiments of the polar solvent include isopropyl alcohol (IPA), n-butanol, γ-butylolactone, N-methylpyrrolidone (NMP), 1, 3-dimethyl-2-imidazolidinone (DMI) and its derivative, and glycol-ether such as carbitolacetate, butylcarbitolacetate or similar substances.

The hole injecting solution 65 forms the hole injecting layer 61 through a drying process. The drying process is performed in a nitrogen atmosphere of 1 Torr of pressure at room temperature. In order to obtain a film with uniform thickness, temperature and pressure are carefully regulated to avoid rapid boiling and evaporation.

After the drying process, the hole injecting layer 61 may be annealed at a temperature of about 200° C. in the 1 Torr nitrogen atmosphere for 10 minutes, thereby removing any solvent or water that remained in the hole injecting layer 61.

The hole injecting layer 61 is formed on the relatively smooth buffer layer 51, so that it is formed having a relatively uniform thickness.

FIG. 3E illustrates that emission solutions 66a, 66b and 66c, exemplary embodiments of which include polymer solutions containing an emission material, are dropped onto the hole injecting layer 61 above the pixel electrode 32.

A solvent for the emission solutions 66a, 66b and 66c is a non-polar solvent when compared with the hole injecting layer 61, thereby preventing the hole injecting layer 61 from dissolving. Exemplary embodiments of the non-polar solvent include cyclohexylbenzene, dihydrobenzofuran, trimethylbenzene, tetramethylbenzene, and similar substances.

The hole injecting layer 61 has a low affinity for the non-polar solvent. Therefore, when the emission solutions 66a, 66b and 66c containing the non-polar solvent are used, it is difficult to adhere the hole injection layer 61 and the resulting organic emission layer 62 closely to each other or to apply the organic emission layer 62 uniformly.

In order to increase the affinity of the hole injecting layer 61 for the non-polar solvent, a surface reforming process is performed before the dropping of the emission solutions 66a, 66b and 66c.

In the surface reforming process, a surface reformer is applied to the hole injecting layer 61, before being dried and evaporated. The surface reformer may include cyclohexylbenzene, dihydrobenzofuran, trimethylbenzene, or tetramethylbenzene, which may be used as the solvent of the emission solutions 66a, 66b and 66c. The surface reformer may further include toluene or xylene similar to these solvents. The surface reformer may be applied by an inkjet method, a spin coating method or a dipping method.

Through the surface reforming process, the surface of the hole injecting layer 61 can be easily fused in the non-polar solvent, so that the emission solutions 66a, 66b and 66c can be applied uniformly.

Referring to FIG. 3F, the emission solution 66a, 66b and 66c may be dried by a method similar to that used for drying the hole injecting solution 65.

After drying the emission solutions 66a, 66b and 66c, thereby forming the organic emission layer 62, the common electrode 71 may be formed to complete the display apparatus as shown in FIGS. 2 and 2A.

Below, another exemplary embodiment of a display apparatus according to the present invention will be described with reference to FIGS. 4 and 4A. For descriptive convenience, components each having the same function are respectively identified by the same reference numerals, and their repetitive description will be omitted.

In the display apparatus according to this exemplary embodiment, a hole injecting layer is not separately formed, and a buffer layer 52 is in direct contact with an organic emission layer 62. The buffer layer 52 may include a hole injecting material, exemplary embodiments of which include a polythiophene derivative such as poly(3,4-ethylene di-oxythiophene: PEDOT) or similar substances and polystyrene sulfonic acid ("PSS").

Figure 4A:
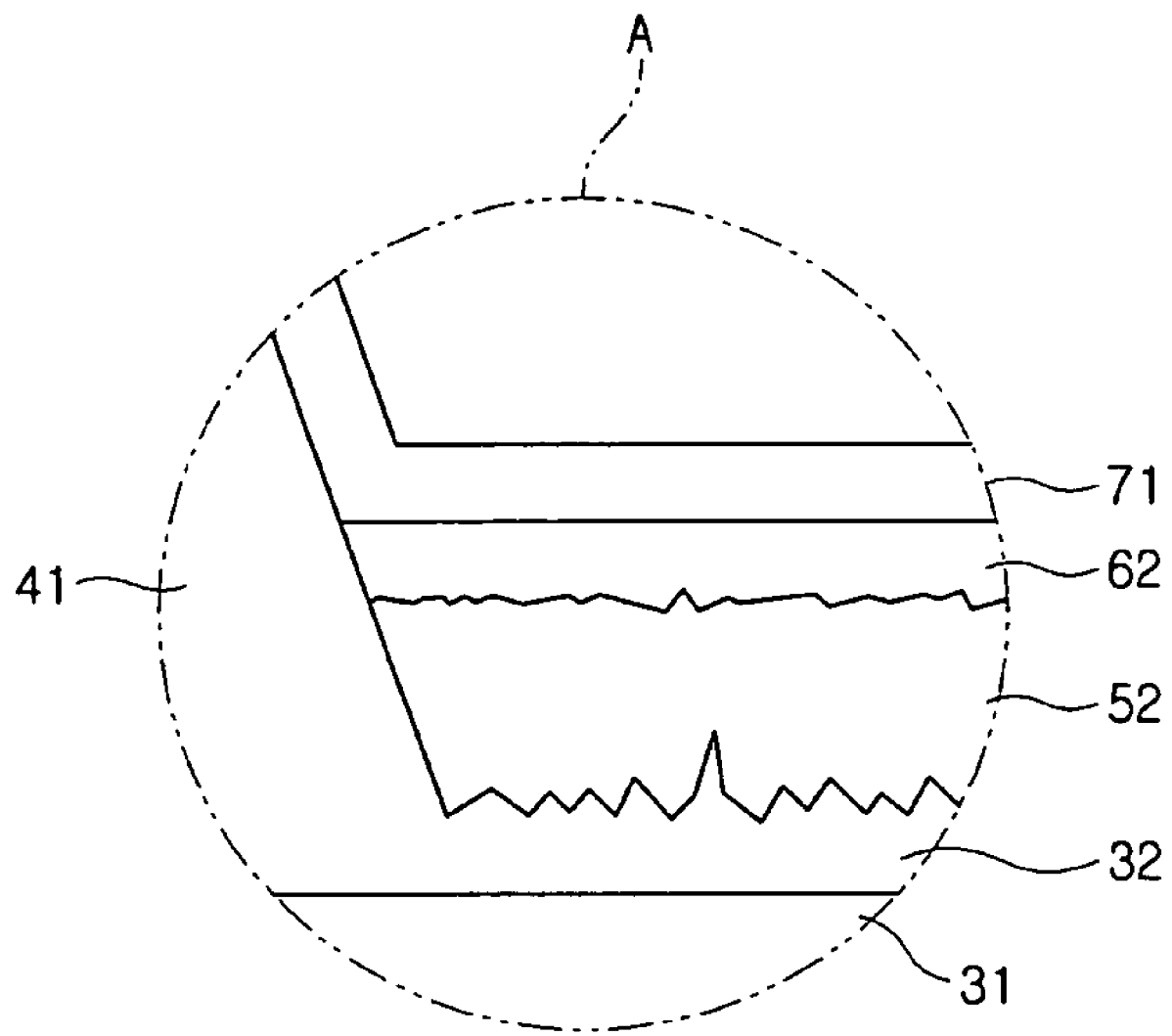
FIG. 4A is an enlarged view of circle 'A' shown in FIG. 4.

Referring to FIG. 4A, an enlarged view of the area in the dotted line circle 'A' of FIG. 4, the buffer layer 52 may be formed by an inkjet method, and therefore is not formed on the upper part of a partition wall 41.

In the foregoing exemplary embodiments, a polymer material may be used for the organic emission layer, but the present invention is not limited thereto. Alternative exemplary embodiments include configurations where a low-molecular weight material is used in the organic emission layer. Alternative exemplary embodiments also include configurations where the organic emission layer may be formed by an evaporating method, a coating method or similar method in addition to the previously described inkjet method.

As described above, the present invention provides a display apparatus where defects due to the roughness of a pixel electrode are reduced, or effectively prevented.

Further, the present invention provides a method of fabricating a display apparatus where defects due to the roughness of a pixel electrode are reduced, or effectively prevented.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A display apparatus comprising:
an insulating substrate;
a thin film transistor formed on the insulating substrate;

a first electrode electrically connected to the thin film transistor and having a first maximum roughness;

a buffer layer formed on the first electrode and having a second maximum roughness smaller than the first maximum roughness;

an organic emission layer formed on the buffer layer; and a second electrode formed on the organic emission layer, wherein the thickness of the buffer layer on the first electrode is about 1.2 to about 10 times larger than the first maximum roughness.

2. The display apparatus according to claim 1, wherein the second maximum roughness is smaller than about 100 Å.

3. The display apparatus according to claim 1, wherein the buffer layer has an average roughness of about 10 Å or less.

4. The display apparatus according to claim 1, wherein the thickness of the buffer layer on the first electrode ranges from about 1,200 Å to about 10,000 Å.

5. The display apparatus according to claim 1, wherein the buffer layer has a work function ranging from about 4.7 eV to about 5.5 eV.

6. The display apparatus according to claim 1, wherein the buffer layer has a light transmissivity of about 85% or more.

7. The display apparatus according to claim 1, wherein the buffer layer has a specific resistance of about 100 Ωcm or less.

8. The display apparatus according to claim 1, wherein the buffer layer comprises a hole injecting material.

9. The display apparatus according to claim 8, wherein the buffer layer comprises poly(3,4-ethylene di-oxythiophene), and polystyrene sulfonic acid.

10. The display apparatus according to claim 1, wherein the buffer layer comprises indium tin oxide (ITO) formed by a sol-gel method.

11. The display apparatus according to claim 10, wherein the first electrode comprises indium tin oxide (ITO).

12. The display apparatus according to claim 1, wherein the buffer layer comprises a conductive polymer.

13. The display apparatus according to claim 12, wherein the buffer layer comprises one selected from a group consisting of polypyrrol, polyaniline and polythiophene.

14. The display apparatus according to claim 1, further comprising a partition wall that divides the first electrodes.

15. The display apparatus according to claim 14, wherein the buffer layer extends to an upper part of the partition wall.

16. The display apparatus according to claim 15, wherein a thickness of the buffer layer on the first electrode is larger than a thickness of the buffer layer on the upper part of the partition wall.

* * * * *